United States Patent [19]

Fujita et al.

[11] 4,451,976

[45] Jun. 5, 1984

[54] MOUNTING APPARATUS FOR LEADLESS ELECTRONIC PARTS

[75] Inventors: Takayuki Fujita, Hirakata; Yoshiaki Yoshida, Takatsuki; Toshiyuki Higashiura, Hirakata; Kunio Tanaka, Neyagawa, all of Japan

[73] Assignee: Matsushita Electric Industrial Co., Ltd., Kadoma, Japan

[21] Appl. No.: 414,256

[22] PCT Filed: Dec. 16, 1981

[86] PCT No.: PCT/JP81/00386
§ 371 Date: Aug. 12, 1982
§ 102(e) Date: Aug. 12, 1982

[87] PCT Pub. No.: WO82/02136
PCT Pub. Date: Jun. 24, 1982

[30] Foreign Application Priority Data

Dec. 17, 1980 [JP] Japan ................................ 55-179456

[51] Int. Cl.³ ............................................. H05K 3/32
[52] U.S. Cl. ....................................... 29/740; 29/840
[58] Field of Search ................ 29/740, 741, 759, 840, 29/832; 228/6 A

[56] References Cited

U.S. PATENT DOCUMENTS 4,327,482  5/1982  Araki et al. ........................... 29/740
4,393,579  7/1983  Van Hooreweder ................. 29/740

Primary Examiner—Carl E. Hall
Attorney, Agent, or Firm—Wenderoth, Lind & Ponack

[57] ABSTRACT

The present invention relates to a mounting apparatus for leadless electronic parts wherein leadless electronic parts 3 supplied through a cylindrical chute 5 are dropped one by one into a part holding hole 7 of a part feeding pusher 6, with the part holding hole having a cutout, the part feeding pusher 6 transports the leadless electronic part 3 between chucks 10 and 11, and then a main block 8 including the chucks 10 and 11 is pivoted such that the leadless electronic parts 3 are taken out and mounted on a mounting portion of a printed circuit board 1 rapidly and reliably.

1 Claim, 14 Drawing Figures

MOUNTING APPARATUS FOR LEADLESS ELECTRONIC PARTS

FIELD OF THE INVENTION

The present invention relates to a mounting apparatus for mounting leadless electronic parts such as chip type resistors and the like onto a printed circuit board.

BACKGROUND OF THE INVENTION

Due to recent developments in the field of leadless electronic parts, a method has been put to practical use in which as shown in FIG. 1, a leadless electronic part 3 is mounted between conductive patterns 2 on a printed circuit board 1 by the use of adhesive 4 and then, is dipped, for soldering thereof, into a tank containing molten solder so that an electrical circuit unit for an electric appliance may be formed.

In conventional mounting apparatuses for leadless electronic parts of this kind, it has been so arranged that leadless electronic parts supplied sequentially from a parts feeder, etc. are transported to their mounting portions of a printed circuit board, while being gripped by a chuck adapted to be opened and closed forcibly by a cylinder. However, the known mounting apparatuses have such inconveniences that they are slow in operations, and have an insufficient mounting accuracy.

DISCLOSURE OF THE INVENTION

Accordingly, the present invention has for its object to provide a mounting apparatus for leadless electronic parts wherein leadless electronic parts supplied through a cylindrical chute are dropped one by one into a part holding hole of a pusher with the part holding hole having a cutout, the pusher transports the leadless electronic part between chucks in response to forward movement of the pusher through pushing thereof, and then a main block including the chucks is pivoted such that the leadless electronic parts are taken out of the pusher and mounted on their mounting portions of a printed circuit board, thus making it possible to effect a reliable and rapid mounting.

THE BEST PREFERRED EMBODIMENT OF THE PRESENT INVENTION

Firstly, a basic structure of the present invention will be described, hereinbelow.

Figure 1:
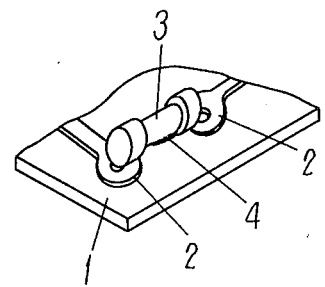
FIG. 1 is a perspective view showing a leadless electronic part mounted on a printed circuit board.
Figure 2:
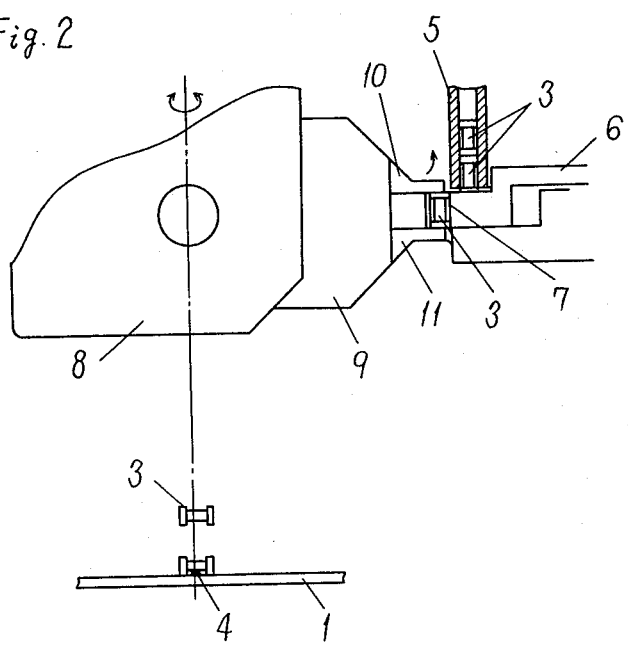
FIG. 2 is a view explanatory of a basic structure of a mounting apparatus for leadless electronic parts, according to one embodiment of the present invention.
Figure 3:
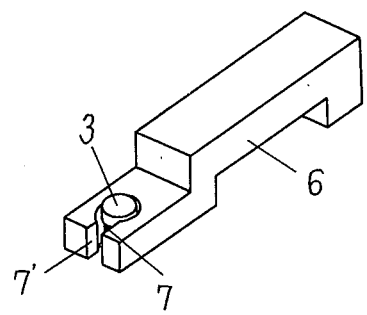
FIG. 3 is a perspective view of a pusher for supplying the leadless electronic parts to the mounting apparatus of FIG. 2.
Figure 4:
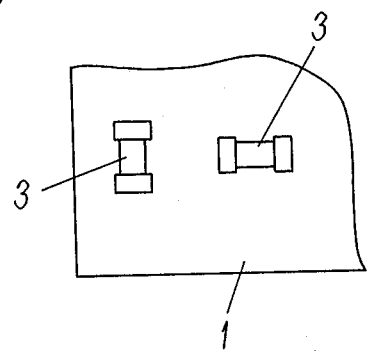
FIG. 4 is a top plan view of the leadless electronic parts mounted on the printed circuit board in an X-axis and a Y-axis directions thereof.
Figure 5:
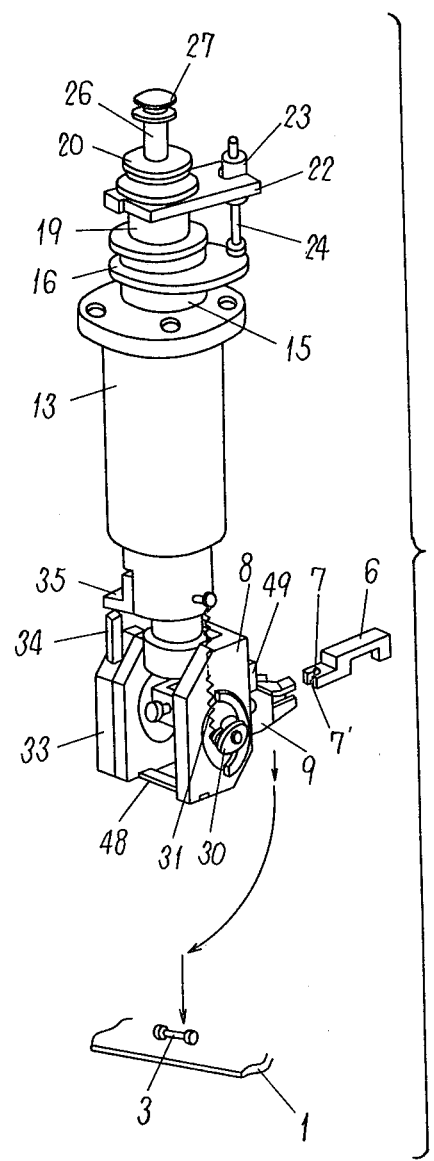
FIG. 5 is a perspective view of the mounting apparatus of FIG. 2.
Figure 6:
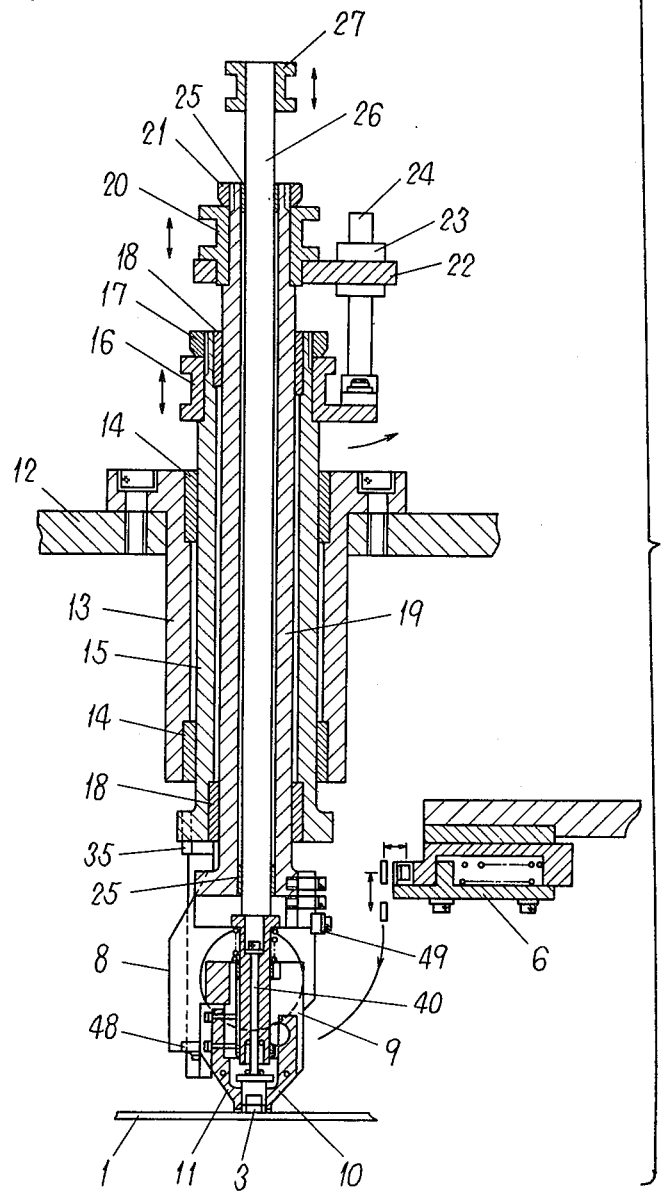
FIG. 6 is a cross-sectional view of the mounting apparatus of FIG. 5.

As shown in FIG. 2, leadless electronic parts 3 supplied in alignment with each other through a cylindrical chute 5 are dropped one by one, into a part holding hole 7 of a part feeding pusher 6 shown in FIG. 3, with the part holding hole 7 having a cutout 7'. Then, the leadless electronic part 3 in the part holding hole 7 is transported, in response to forward movement of the part holding pusher 6 through pushing thereof, between chucks 10 and 11 of a chuck body 9 provided on a main block 8. Thereafter, the main block 8 is pivoted such that the leadless electronic parts 3 are taken out of the part holding hole 7 of the part feeding pusher 6 and are mounted at predetermined positions on a printed circuit board 1, with adhesive 4 being applied to the predetermined positions.

Meanwhile, since the main block 8 is adapted to be rotatable in a horizontal direction, it is possible to mount the leadless electronic parts 3 on the printed circuit board 1 either in an X-axis direction or in a Y-axis direction thereof arbitrarily.

Hereinbelow, a mounting apparatus for leadless electronic parts, according to the present invention will be described.

A reference numeral 12 is a base. A bearing flange 13 is secured to the base 12. A vertical movement synchronizing shaft 15 of a cylindrical configuration is mounted in the bearing flange 13 through bearings 14. A cam follower guide 16, into which one end of a lever adapted to be controlled by a cam is fitted such that vertical movement of the cam follower guide 16 is controlled, is fixedly fitted around an outer periphery of an upper end of the vertical movement synchronizing shaft 15 by a nut 17. Meanwhile, a main shaft 19 is mounted in the vertical movement synchronizing shaft 15 through bearings 18 and the above described main block 8 is coupled with a lower end of the main shaft 19. Furthermore, a cam follower guide 20 which is engaged with a lever adapted to be controlled by a cam is fixedly fitted around an outer periphery of an upper end of the main shaft 19 by a nut 21. A lever 22 is secured to the cam follower guide 20. A bearing 23 is provided at a distal end of the lever 22 and a rod 24 which is attached to the cam follower guide 16 so as to extend upwardly is fitted into the bearing 23.

Moreover, a pusher rod 26 is mounted in the main shaft 19 through bearings 25 and further, a cam follower guide 27 which is engaged with a lever adapted to be controlled by a cam is also secured to an upper end of the pusher rod 26.

Figure 7:
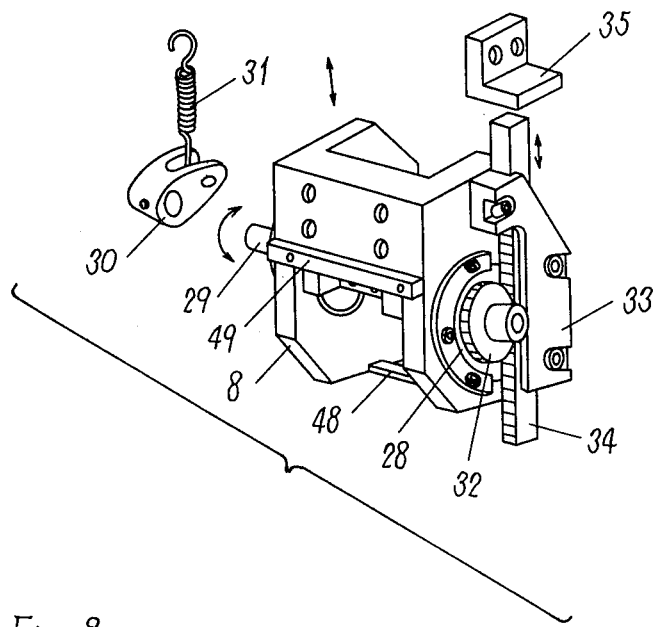
FIG. 7 is an exploded perspective view of a main block of the mounting apparatus of FIG. 5.
Figure 8:
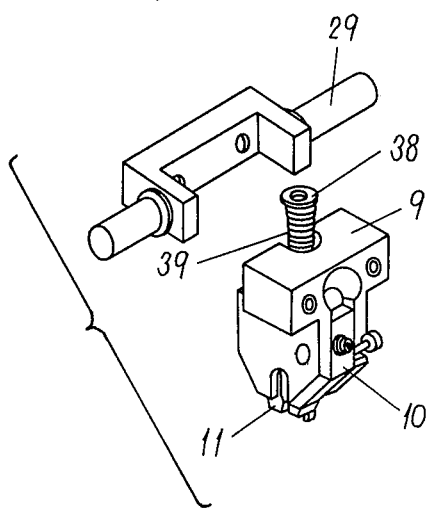
FIG. 8 is an exploded perspective view of a chuck body of the mounting apparatus of FIG. 5.

The substantially U-shaped main block 8 fixed to the lower end of the main shaft 19 is provided with bearings 28 as shown in FIG. 7 and a crankshaft 29 shown in FIG. 8 is supported by the bearings 28. A lever 30 is fixed to one end of the crankshaft 29 and is connected with a tension spring 31 such that the crankshaft 29 is urged at all times by the tension spring 31 to be rotated in one direction. Meanwhile, a pinion 32 is secured to the other end of the crankshaft 29 and is meshed with a rack 34 held by a rack guide 33 which is mounted on one outer side face of the main block 8. Furthermore, an upper end of the rack 34 confronts a stopper 35 attached to a lower end of the vertical movement synchronizing shaft 15.

Figure 9:
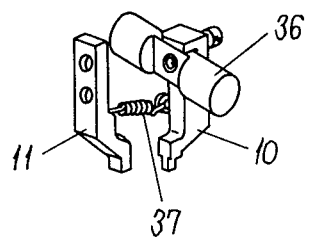
FIG. 9 is a perspective view of a chuck portion of the mounting apparatus of FIG. 5.

Meanwhile, as shown in FIG. 8, the chuck body 9 is mounted on a central portion of the crankshaft 29. An opening and closing chuck 10 and a fixed chuck 11 are incorporated into the chuck body 9 as shown in FIG. 9. The opening and closing chuck 10 is provided so as to be rotatable through a support shaft 36 while a chuck spring 37 is provided between the opening and closing chuck 10 and the fixed chuck 11.

Figure 10:
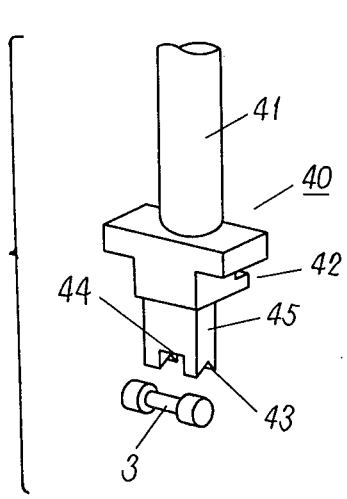
FIG. 10 is a perspective view of a stripper portion of the mounting apparatus of FIG. 5.
Figure 11:
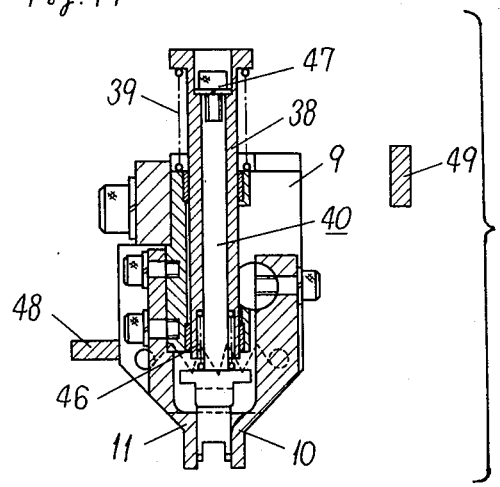
FIG. 11 is a cross-sectional view of the chuck portion of the mounting apparatus of FIG. 5, and FIGS. 12A, 12B and 12C are views explanatory of mounting states of the leadless electronic part mounted on the printed circuit board in accordance with deformation of the printed circuit board.

A stripper holder 38 is mounted in a central portion of the chuck body 9 through a compression spring. A shaft portion 41 of a stripper 40 shown in FIG. 10 is fitted into the stripper holder 38 and the stripper 40 has a substantially T-shaped guide portion 42 formed at a lower end thereof. The guide portion 42 has a part positioning portion 45 formed at a lower end thereof. The part positioning portion 45 has a V-groove 43 formed at a lower face thereof and a cutout 44 formed at a central portion of the V-groove 43. Furthermore, a compression spring 46 is wound around the shaft portion 41 such that a lower end and an upper end of the compression spring 46 are, respectively, retained by the guide portion 42 of the stripper 40 and a lower end of the stripper holder 38. A stopper 47 for regulating downward movement of the shaft portion 41 is provided at an upper end of the shaft portion 41. A whole structure of the above described chuck portion is shown in FIG. 11.

The above described main block 8 is provided with stoppers 48 and 49 for regulating pivotal movement of the chuck body 9.

Meanwhile, a distal end of the opening and closing chuck 10 is of such a small width that it is fitted into the cutout 7' of the part holding hole 7 of the part feeding pusher 6.

Hereinbelow, operations of the mounting apparatus for leadless electronic parts, according to the present invention will be described.

In synchronizm with the vertical movement synchronizing shaft 15 having the stopper 35 secured thereto, the main shaft 19 is moved downwardly by the cam follower guide 20 in engagement with the lever which is adapted to be pivoted by the cam, with the leadless electronic part 3 supplied one by one by the part feeding pusher 6 being gripped vertically by the chucks 10 and 11. The leadless electronic part is taken out of the part feeding pusher 6 through the cutout 7' of the part holding hole 7 of the part holding pusher 6 upon downward movement of the main shaft 19.

Then, when downward movement of the vertical movement synchronizing shaft 15 is stopped and only the main shaft 19 is moved downwardly, downward movement of the stopper 35 is stopped, so that the lever 30, crankshaft 29 and pinion 32 are pivoted by the tension spring 31 and thus, the rack 34 in engagement with the pinion 32 is moved upwardly so as to be brought into contact with the stopper 35. Upon the pivotal movement of the crankshaft 29, the chuck body 9 is pivoted in a clockwise direction while being moved downwardly and the pivotal movement of the chuck body 9 is stopped upon its contact with the stopper 48. Thus, the leadless electronic part 3 is disposed at a lower end of the mounting apparatus so as to confront the printed circuit board, as shown in FIG. 11.

The main shaft 19 is further moved downwardly at this state and thus, the leadless electronic part 3 is brought into contact with the printed circuit board 1. Thereafter, the pusher rod 26 is moved downwardly by the cam follower guide 27 in engagement with the lever adapted to be controlled by the cam, so that the stripper holder 38 is moved downwardly against urging force of the compression spring 39 so as to depress the stripper 40 downwardly and thus, the part positioning portion 45 of the stripper 40 is moved downwardly between the opening and closing chuck 10 and the fixed chuck 11 such that the leadless electronic part 3 is pressed onto the printed circuit board 1, with opposite ends of the leadless electronic part 3 being held by the V-groove 43, whereby the leadless electronic part 3 is mounted on the printed circuit board 1 by the adhesive 4. At this state the main shaft 19 is moved upwardly and thus, the leadless electronic part 3 is withdrawn from the chucks 10 and 11.

Thereafter, since the pusher rod 26 is also moved upwardly and further, the main shaft 19 is moved upwardly, the rack 34 is moved downwardly upon its contact with the stopper 35, so that the pinion 32 is pivoted and thus, the crankshaft 29 is pivoted, whereby the chuck body 9 mounted on the crankshaft 29 is pivoted in a counterclockwise direction until the chuck body 9 is brought into contact with the stopper 49. Then, the chuck body 9 is moved upwardly together with the vertical movement synchronizing shaft 15 so as to be restored to the state shown in FIG. 2 in which the chuck body 9 is ready to receive the leadless electronic part 3 supplied by the part feeding pusher 6. At this time, the chucks 10 and 11 confront each other with a clearance therebetween slightly smaller than a size of the leadless electronic part 3. Thus, when the leadless electronic part 3 is fed into the clearance by the part feeding pusher 6, the clearance is forcedly expanded through tapered ends of the chucks 10 and 11 such that the leadless electronic part 3 is gripped by the chucks 10 and 11.

Meanwhile, selection of the X-axis direction or the Y-axis direction for mounting the leadless electronic part 3 on the printed circuit board 1 can be effected by pivoting the cam follower guide 16 through 90° so as to rotate the main shaft 19 and the vertical movement synchronizing shaft 15 through coupling of the bearing 23 of the lever 22 and the rod 24 provided on the cam follower guide 16.

Figure 12:
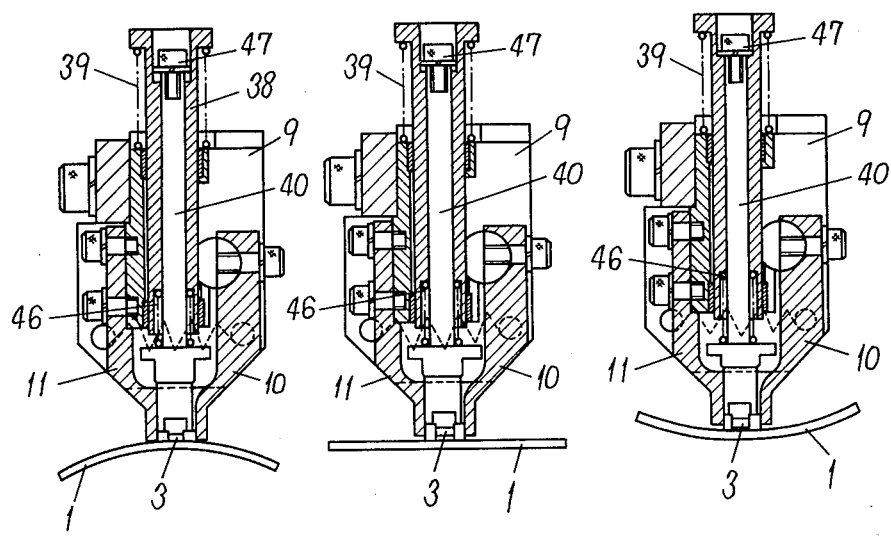

Furthermore, although the printed circuit board 1 may be selectively curved upwardly, held flat normally and curved downwardly as shown in FIGS. 12A, 12B and 12C, respectively, pushing force of the pusher rod 26 is transmitted to the leadless electronic part 3 and the printed circuit board 1 through its absorption by the compression spring 39 of the stripper holder 38 and the compression spring 46 of the stripper 40, so that an impact force applied to the printed circuit board 1 is reduced, whereby the leadless electronic part 3 can be bonded to the printed circuit board 1 positively and reliably.

UTILIZATION IN INDUSTRIES

As is clear from the foregoing description, in accordance with the mounting apparatus for leadless electronic parts, according to the present invention, since the clearance between the chucks is forcedly expanded by the part feeding pusher such that the leadless electronic part is gripped by the chucks, a period of time required for the chucks to grip the leadless electronic part is reduced compared with chucks of a type wherein the chucks are selectively opened and closed by a cylinder, etc. Furthermore, in accordance with the present invention, since the stripper is guided by the chuck body so as not to be positioned inaccurately, the leadless electronic part can be mounted on the printed circuit board accurately, the printed circuit board is not subjected to the impact force at the time of mounting thereon of the leadless electronic part, and the leadless electronic parts mounted previously on the printed circuit board are not displaced from their respective mounting positions at the time of mounting of another leadless electronic part. Moreover, in accordance with the present invention, the pusher rod, main shaft and vertical movement synchronizing shaft constitute a triple shaft structure, they can be made compact in size. Furthermore, since the pusher rod, main shaft and vertical movement synchronizing shaft are controlled by the cam follower guides, respectively, it becomes possible to perform their rapid and reliable drive, thereby providing the mounting apparatus of a remarkably high industrial value.

What is claimed is:

1. A mounting apparatus for mounting leadless electronic parts on a printed circuit board having conductive patterns by the use of adhesive, comprising:
   a base;
   a bearing flange;
   a vertical movement synchronizing shaft which is mounted on said base through said bearing flange so as to be movable vertically and rotable;
   a main shaft which is mounted in said vertical movement synchronizing shaft so as to be movable vertically such that said main shaft is coupled with said vertical movement synchronizing shaft in a rotating direction thereof;
   a pusher rod which is mounted in said main shaft so as to be movable vertically;
   cam follower guides which are, respectively, provided on said vertical movement synchronizing shaft, said main shaft and said pusher rod for their respective control;
   a main block which is provided at a lower end of said main shaft;
   a crankshaft urged at all times to rotate in one direction, which is supported by said main block;
   a pinion secured to said crankshaft;
   a rack which is provided on said main block so as to be meshed with said pinion;
   a stopper which is provided at a lower end of said vertical movement synchronizing shaft so as to control said rack;
   a chuck body provided with a chuck for gripping the leadless electronic part supplied by a part feeding pusher, which is mounted on said crankshaft;
   a stripper holder which is mounted in said chuck body at a central portion thereof through a compression spring; and
   a stripper having a V-groove formed at a lower face thereof, which is fitted into said stripper holder;
   said stripper being pushed upon downward movement of said pusher rod, whereby the leadless electronic part gripped by said chuck is taken out of said chuck so as to be pressed onto a mounting portion of said printed circuit board.

* * * * *